(12) United States Patent
Kawasumi et al.

(10) Patent No.: US 8,018,757 B2
(45) Date of Patent: Sep. 13, 2011

(54) SEMICONDUCTOR MEMORY DEVICE AND TRIMMING METHOD THEREOF

(75) Inventors: Atsushi Kawasumi, Kawasaki (JP); Yukihiro Urakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 173 days.

(21) Appl. No.: 12/539,883

(22) Filed: Aug. 12, 2009

(65) Prior Publication Data
US 2010/0046279 A1    Feb. 25, 2010

(30) Foreign Application Priority Data
Aug. 25, 2008  (JP) ................................ P2008-215014

(51) Int. Cl.
*G11C 11/00* (2006.01)
(52) U.S. Cl. ........................................ 365/154; 365/201
(58) Field of Classification Search .................. 365/154, 365/201, 156
See application file for complete search history.

(56) References Cited

U.S. PATENT DOCUMENTS
| 5,361,232 A * | 11/1994 | Petschauer et al. ........... 365/201 |
| 6,385,081 B1 * | 5/2002 | Shiomi ......................... 365/154 |
| 6,584,026 B2 | 6/2003 | Kawasumi |
| 7,382,674 B2 * | 6/2008 | Hirabayashi .................. 365/226 |
| 7,477,560 B2 | 1/2009 | Kawasumi |

FOREIGN PATENT DOCUMENTS
| JP | 06-168591 | 6/1994 |
| JP | 10-162585 | 6/1998 |
| JP | 2004-127499 | 4/2004 |

OTHER PUBLICATIONS

Japanese Office Action issued Nov. 2, 2010, in Patent Application No. 2008-215014 (with English-language translation).

* cited by examiner

*Primary Examiner* — Anh Phung
(74) *Attorney, Agent, or Firm* — Oblon, Spivak, McClelland, Maier & Neustadt, L.L.P.

(57) ABSTRACT

The first power supply terminal is connected to source electrodes of the first and third transistors. The second power supply terminal is connected to source electrodes of the second and fourth transistors. When offset information of the memory cell is to be read, a voltage applied to the first power supply terminal and a voltage applied to the second power supply terminal are made equal. Then the voltage applied to the first power supply terminal is returned to the first potential, and the voltage applied to the second power supply terminal is returned to the second potential. When stress is generated in the first to fourth transistor included in the first or second inverter, the potential difference between the first power supply terminal and the second power supply terminal is made larger than a difference between the first potential and the second potential.

20 Claims, 6 Drawing Sheets

SEMICONDUCTOR MEMORY DEVICE AND TRIMMING METHOD THEREOF

CROSS REFERENCE TO RELATED APPLICATIONS

This application is based on and claims the benefit of priority from prior Japanese Patent Application No. 2008-215014, filed on, Aug. 25, 2008, the entire contents of which are incorporated herein by reference.

BACKGROUND OF THE INVENTION

1. Field of the Invention

The present invention relates to a semiconductor memory device. More specifically, the present invention relates to a semiconductor memory device having a function of trimming the variation in threshold voltages of memory cells. Moreover, the present invention relates to a trimming method of the threshold voltage using such a semiconductor memory device.

2. Description of the Related Art

In recent years, for improving the integration of the semiconductor memory device, a size of a transistor forming a memory cell or a sense amplifier is downsized. Moreover, a threshold voltage of the transistor is also made lower with the reduction of the power supply voltage. Thus, variation (offset) of threshold voltages of the transistors included in memory cells or sense amplifiers greatly affect operation of the memory cells or the sense amplifiers.

Particularly, in SRAM, offset of transistors included in memory cells reduces a static noise margin (referred to as SNM hereinbelow) of the memory cell. A memory cell with a low SNM is unstable in operation. Thus, when a minute voltage caused by noise or the like is applied from a bit line, false writing (disturb) occurs at a memory cell due to such the minute voltage. Moreover, the transistor included in the sense amplifier may have offset. In this case, the operation of the sense amplifier is delayed until the signal level on the bit line increase to be larger than the offset.

A method for solving an above-mentioned problem is disclosed in JP 10-162585A. In this method, a semiconductor memory device includes therein a structure for trimming offset. In addition, a voltage suitable for amount of trimming is applied to a transistor included in the memory cell or the sense amplifier.

However, in the method, it is necessary to provide trimming means and trimming amount adjustment means in addition to a memory cell and a sense amplifier. Thus, the area of the semiconductor memory device may increase.

Moreover, since this method needs trimming of the memory cells or sense amplifiers on a one-by-one basis, it needs a lot of time to trim all memory cells or sense amplifiers in the semiconductor memory device.

Therefore, in the conventional art, it is difficult to provide a semiconductor memory device that can trim offset of the memory cell with a high efficiency while avoiding the area of the semiconductor memory device from being large.

SUMMARY OF THE INVENTION

A semiconductor memory device according to one aspect of the present invention comprises: a memory cell including a flip-flop including a first inverter and a second inverter connected to each other in a cross-coupling manner, the first inverter including first and second transistors connected to each other so that their current paths are serially connected, the second inverter including third and fourth transistors connected to each other so that their current paths are serially connected; a first power supply terminal connected to a source electrode of the first transistor and a source electrode of the third transistor, and supplied with a first potential in a normal operation; a second power supply terminal connected to a source electrode of the second transistor and a source electrode of the fourth transistor, and supplied with a second potential in a normal operation; and a control circuit operative to control a voltage applied to the first power supply terminal and the second power supply terminal. The control circuit is configured to perform control such that when offset information of the memory cell is to be read, a voltage applied to the first power supply terminal and a voltage applied to the second power supply terminal are made equal, then the voltage applied to the first power supply terminal is returned to the first potential, and the voltage applied to the second power supply terminal is returned to the second potential, whereas when stress is generated in the first to fourth transistor included in the first inverter or the second inverter, the potential difference between the first power supply terminal and the second power supply terminal is made larger than a difference between the first potential and the second potential.

A method of trimming a memory cell in a semiconductor memory device according to one aspect of the present invention is provided. The memory cell includes a first inverter and a second inverter connected to each other in a cross-coupling manner. The first inverter includes first and second transistors connected to each other so that their current paths are serially connected. The second inverter includes third and fourth transistors connected to each other so that their current paths are serially connected. The method comprises: after a voltage applied to a source electrode of the first transistor and a source electrode of the third transistor is equalized with a voltage applied to a source electrode of the second transistor and a source electrode of the fourth transistor, switching a voltage applied to a source electrode of the first transistor and a source electrode of the third transistor to a first potential, while switching a voltage applied to a source electrode of the second transistor and a source electrode of the fourth transistor to a second potential lower than the first potential, thereby reading offset information of the memory cell, and amplifying potential difference between a voltage applied to a source electrode of the first transistor and a source electrode of the third transistor and a voltage applied to a source electrode of the second transistor and a source electrode of the fourth transistor to a value larger than the difference between the first potential and the second potential, thereby generating a stress at the first to fourth transistors.

DETAILED DESCRIPTION OF THE EMBODIMENTS

Then, a semiconductor memory device according to an embodiment of the present invention will be described with reference to attached drawings.

Structure of this Embodiment

Figure 1:
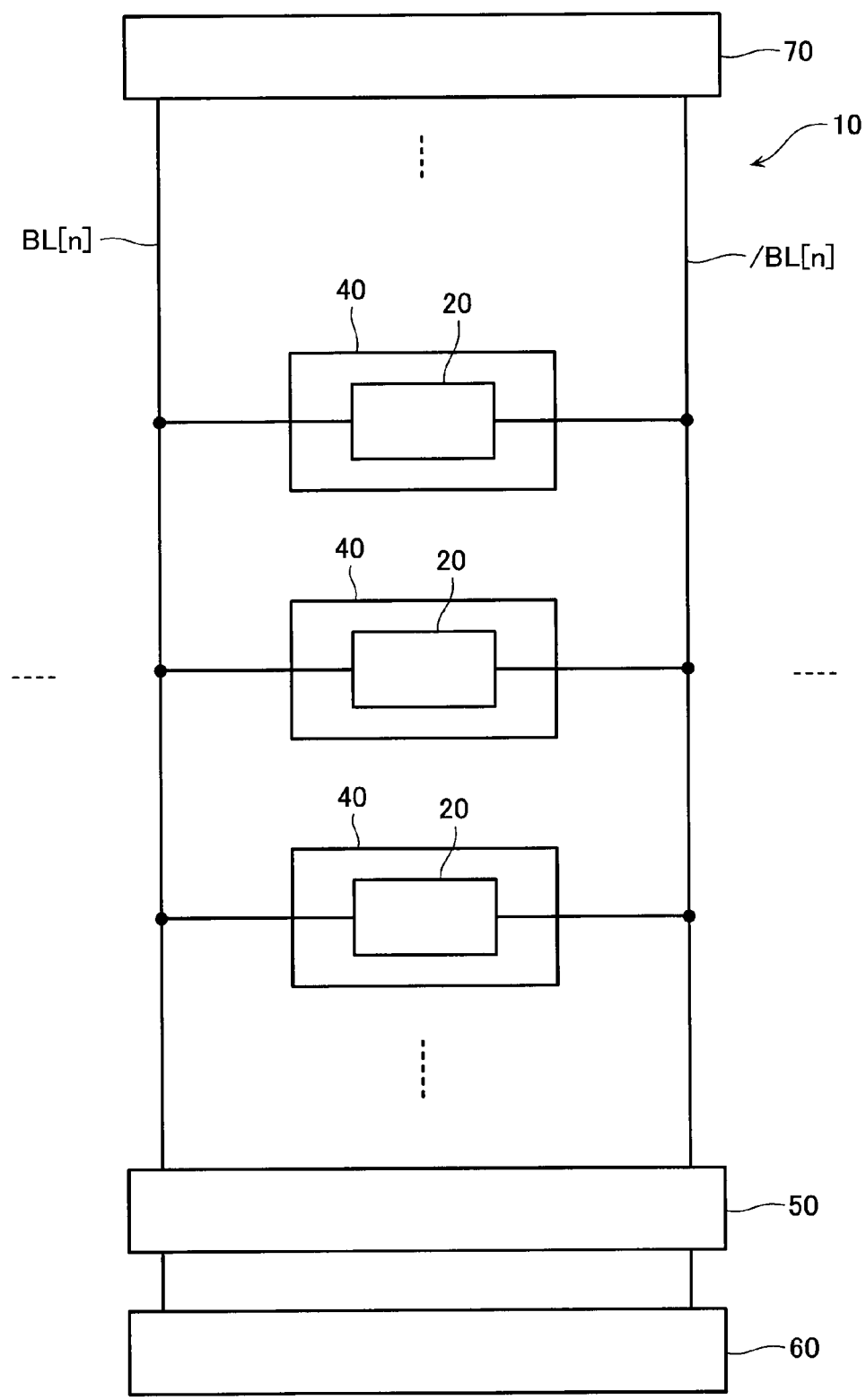
FIG. 1 is a schematic view illustrating an SRAM 10 according to an embodiment of the present invention.
Figure 2:
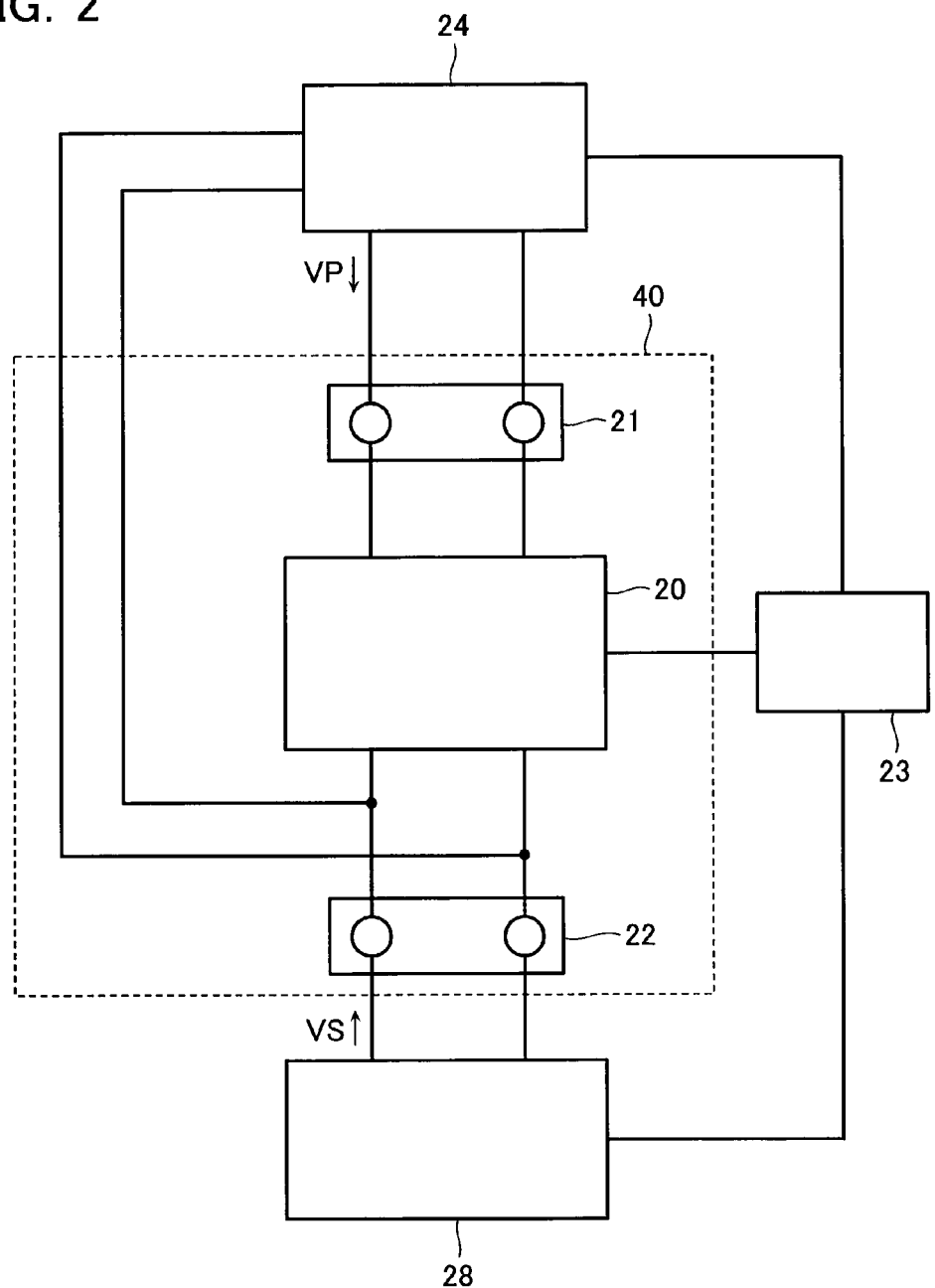
FIG. 2 is a schematic view of the first circuit 40 in the SRAM.

FIG. 1 is a schematic view illustrating relations of a first circuit 40, a sense amplifier 50, an output buffer 60 and a writing circuit 70 formed within a semiconductor memory device 10 (SRAM) according to the embodiment of the present invention. The first circuit 40 includes a memory cell. FIG. 2 is a schematic view illustrating an internal structure of the first circuit 40.

Figure 3:
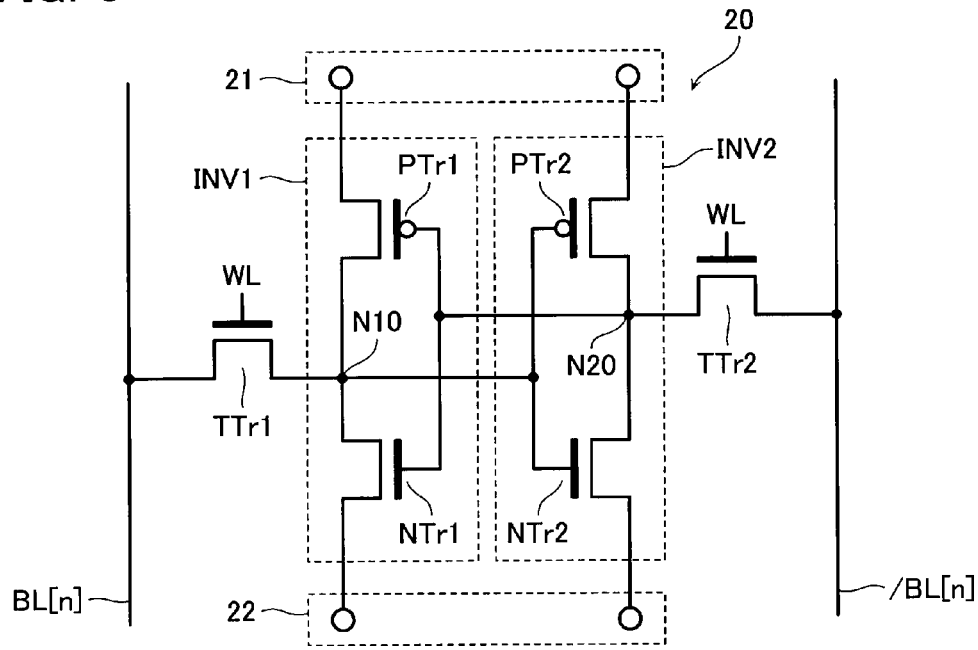
FIG. 3 is a circuit diagram of the memory cell 20 in the SRAM.

FIG. 3 is a circuit diagram of the memory cell 20.

As shown in FIG. 1, the SRAM 10 according to this embodiment compares and amplifies data read from a plurality of the memory cells 20 at sense amplifier 50, and transfers the data to an output buffer 60. Data is transferred from a writing circuit 70 when data is written in the memory cell 20.

As shown in FIG. 2, the first circuit 40 comprises a memory cell 20, a first power supply terminal 21 and a second power supply terminal 22. Note that the first circuit 40 receives a signal from a memory cell control unit 23. In addition, an external power source 24, and a source voltage control unit 28 are connected to the first circuit 40.

Note that although FIG. 2 illustrates one first circuit 40, the memory cell control unit 23, the external power source 24 and the source voltage control unit 28 are commonly provided for the plural first circuits 40.

The memory cell 20 includes an inverter INV1 (a first inverter) and an inverter INV2 (a second inverter), as shown in FIG. 3. These two inverters are connected in a cross-coupling manner at data storage nodes N10 and N20. A transfer transistor TTr1 is formed between the data storage nodes N10 and the bit line BL[n]. A transfer transistor TTr1 transfers data held at the node N10 to the bit line BL[n] (n is a natural number not less than 0).

Moreover, a transfer transistor TTr2 is formed between the data storage nodes N20 and the bit line /BL [n]. The transfer transistor TTr2 transfers data held at the node N20 to the bit line /BL [n].

Note that, the transfer transistors TTr1 and TTr2 have respective gates connected to the word line WL. The inverter INV1 connects a pMOS transistor PTr1 (a first transistor) and an nMOS transistor NTr1 (a second transistor) so that their current paths are connected in series.

The inverter INV2 connects a pMOS transistor PTr2 (a third transistor) and an nMOS transistor NTr2 (a fourth transistor) so that their current paths are connected in series.

The input terminal of the inverter INV1 is connected to the node N20, and the input terminal of the inverter INV2 is connected to the node N10.

The first power supply terminal 21 is connected to sources of the pMOS transistor PTr1 and the pMOS transistor PTr2. The external power source 24 (a first voltage control unit) is provided commonly for the plural first circuits 40. The first power supply terminal 21 is connected to an output terminal of the external power source 24. The second power supply terminal 22 is connected to sources of the nMOS transistor NTr1 and the nMOS transistor NTr2. The second power supply terminal 22 is connected to an output terminal of the source voltage control unit 28 provided commonly for the plural first circuits 40.

The external power supply 24 is formed outside of the SRAM 10. The output terminal thereof is connected to the first power supply terminal 21 in each of the memory cell 20, while the input terminal thereof is connected to sources of the nMOS transistor NTr1 and the nMOS transistor NTr2 in the memory cell 20. The external power supply 24 controls, via the first power supply terminal 21, a voltage VP applied to a source (the first main electrode) of the pMOS transistor PTr1 in the memory cell 20 and a source (the first main electrode) of the PMOS transistor PTr2.

The source voltage control unit 28 (a second voltage control unit) is formed outside of the SRAM 10. The output terminal thereof is connected to a source (the first main electrode) of the nMOS transistor NTr1 in each memory cell 20 and to a source (the first main electrode) of the nMOS transistor NTr2 through the second power supply terminal 22.

In addition, the source voltage control unit 28 functions as a control unit for controlling a voltage VS applied to sources of the nMOS transistor NTr1 and the nMOS transistor NTr2 in the memory cell 20. As described below, the external power supply 24 and the source voltage control unit 28 controls the voltages VP and VS when offset information of the memory cell 20 is to be read. Moreover, the external power supply 24 controls the voltage VP when offset of the memory cell 20 is to be adjusted. The detail thereof is described below.

The input terminal of the memory cell control unit 23 is connected to the external power source 24 and the source voltage control unit 28. The output terminal thereof is connected to each of the memory cell 20.

Figure 4:
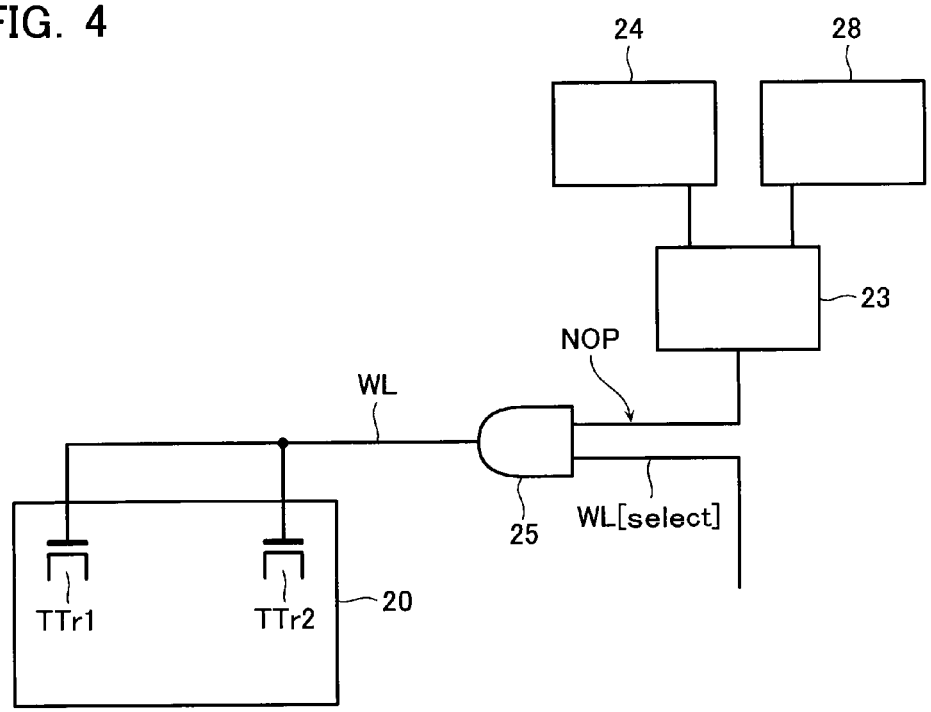
FIG. 4 illustrates a structure of the memory cell control unit 23 in the SRAM.

When a certain memory cell 20 is set at a non-operating state, the memory cell control unit 23 outputs non-operation signal NOP to the the memory cell 20. As shown in FIG. 4, the output terminal of the memory cell control unit 23 is connected to an input terminal of an AND gate 25. Another input terminal of the AND gate 25 is provided with a word line selection signal WL [select]. In addition, a word line WL is connected to an output terminal of the AND gate 25. The word line WL is connected to the transfer transistors TTr1 and TTr2 in the memory cell 20.

In a structure shown in FIG. 4, a non-operation signal NOP "0" outputted from the memory cell control unit 23 causes the word line WL[m+1] to be provided with "0", even when the word line WL is applied with a word line selection signal WL [select] "1" for activating the memory cell 20 for data write or read. Therefore, the transfer transistors TTr1 and TTr2 do not turn on. This means the memory cell control unit 23 can control the memory cell 20.

Having such a structure, the SRAM 10 according to this embodiment can perform trimming of the memory cells 20 in a lump (specifically, adjusting variation (hereinafter, offset) in threshold voltages of the nMOS transistors NTr1 and NTr2 included in the memory cell 20 or offset in threshold voltages of the pMOS transistors PTr1 and PTr2).

Operation of First Embodiment

As described above, the external power source 24 and the source voltage control unit 28 control the voltages VP and VS when offset information of the memory cell 20 is to be read.

Moreover, the external power source 24 controls the voltage VP when offset of the memory cells 20 is adjusted or modified. Specifically, the external power source 24 and the source voltage control unit 28 control the voltages VP and VS when offset information of the memory cells 20 is to be read, so that the voltages VP and VS becomes substantially equal to each other during a certain period. Moreover, when modification of the offset is to be performed, differences between the voltage VP and the voltage VS are controlled to be larger than that at the normal operation (for example, 1.5 V, which is larger than the normal voltage 1.0 V).

Figure 5:
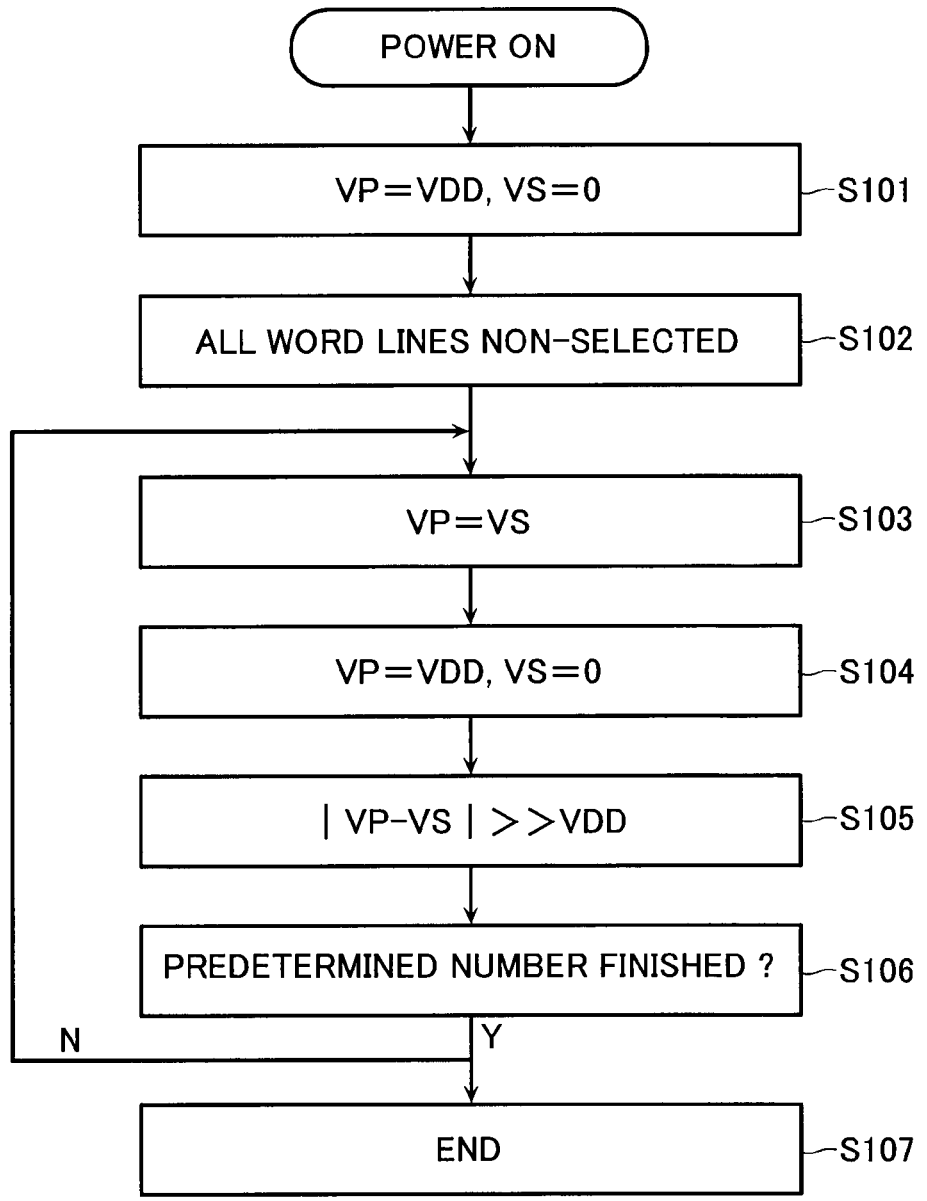
FIG. 5 is a flowchart showing a process for reading offset information of the memory cells and adjusting the offset.

This operation is described in detail with reference to the drawings. A process of reading offset information of the memory cell 20 and adjusting offset in the SRAM 10 according to this embodiment is described with reference to a flow chart of FIG. 5. After power-on operation of the SRAM 10, the voltages VP and VS are set at the initial value (a first potential and a second potential).

In the normal operation, the voltages VP and VS are kept at the initial value. Herein, as just an example, the voltage VP is set at a power supply voltage VDD (a first potential), and the voltage VS is set at 0 V (a second potential). That is, |VP−VS| is equal to the power supply voltage VDD.

Next, the voltages of all the word lines WL are set at 0 V to set all of the memory cells 20 at a non-selection state (step S102).

Then, for reading the offset information, a control is performed so that the voltage VS is equal to the voltage VP (step S103). After a certain time elapses in step S104, the voltages VP and VS returns to the initial-stage voltages (first and second potentials: VP=VDD, VS=0V). This operation causes only a transistor with a low threshold voltage among the transistors PTr1 PTr2, NTr1, and NTr2 in the memory cell 20 to turn on, while the others with a high threshold voltage to keep an OFF state. Offset information is thereby acquired. Note that when the voltages VP and VS are changed in amplitude, it is not preferable to change them quickly but to change them moderately, for reducing a noise that occurs at the time of voltage shift.

Thereafter, at step S105, a difference between the voltages VP and VS is set at a value much larger than the power supply voltage VDD (a difference between the first and second potentials), for modifying the offset (|VP−VS|>>VDD). For example, if VDD is 1.0 V, the voltages VP and VS are set so that |VP−VS| is equal to =1.5 V. The above-described operations are repeated for the predetermined number of times (step S106).

The control of the voltages VP and VS for reading offset information is different depending on which one of the transistors PTr1, PTr2, NTr1, and NTr2 in the memory cell 20 is subject to reading of the offset information. Hereinafter, the following three cases (1)-(3) are explained in order.
(1) When reading offset information of the nMOS transistors NTr1 and NTr2
(2) When reading offset information of the pMOS transistors PTr1 and PTr2
(3) When reading offset information of all of the transistors
    These three cases (1)-(3) are explained hereinbelow.
[(1) When Reading Offset Information of the nMOS Transistors NTr1 and NTr2]

Figure 6:
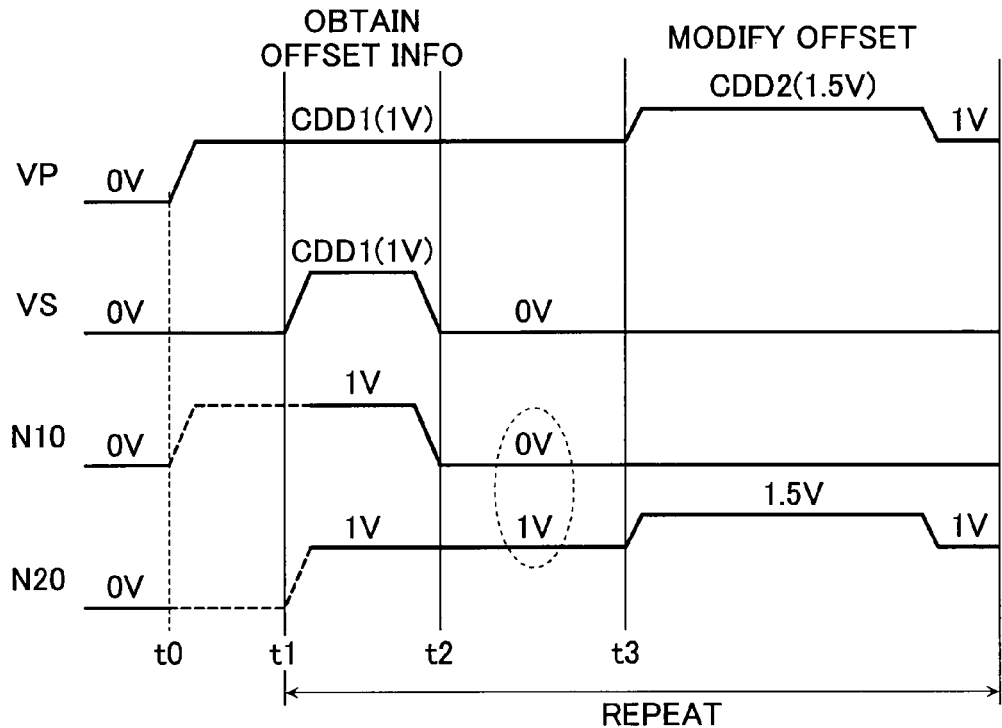
FIG. 6 is a timing chart showing an operation of reading offset information of memory cells, and adjusting the offset of the memory cells.

First of all, with reference to a timing chart of FIG. 6, an operation for reading offset information of the nMOS transistors NTr1 and NTr2 is described. A case where a threshold voltage of the nMOS transistor NTr1 is lower than that of the nMOS transistor NTr2 is explained as an example hereinbelow. The modification of the threshold voltage is performed.

At first, the voltages VP and VS are set at the initial values, i.e., VP=VDD1 (1.0 V), VS=0 V at time t0. Then, at time t1, the voltage VP is kept at the voltage VDD1 (1.0 V), while the voltage VS is made equal to the voltage VP (VP=VS=VDD1=1.0 V). Thereafter, the voltage VS returns to 0 V again at time t2.

When the voltage VS changes from 1.0 V to 0 V, only the nMOS transistor NTr having a low threshold voltage turns on. This creates a potential difference (offset information) between sources of the nMOS transistors NTr1 and NTr2. That is, data "0" is stored in the node N10, while data "1" is stored in the node N20.

When the external power source 24 detects the offset information generated at sources of the nMOS transistors NTr1 and NTr2, it provides a stress-generation voltage VDD2 (i.e., 1.5 V) to sources of the PMOS transistors PTr1 and PTr2 as the voltage VP, at time t3. The voltage VS is kept at 0 V during this period.

When a threshold voltage of the nMOS transistor NTr1 is lower than that of the nMOS transistor NTr2, and the nMOS transistor NTr1 turns on, the pMOS transistor Ptr1 is in an OFF state, while the pMOS transistor Ptr2 is in an ON state. Accordingly, the stress generation voltage VDD2 is applied only to a gate of the nMOS transistor NTr1 through the PMOS transistor PTr2, and is not applied to a gate of the nMOS transistor NTr2. The gate insulation film of the nMOS transistor NTr1 applied with the voltage VDD2 (1.5 V) for generating stress therein is deteriorated by BTI (Bias Temperature Instability). The operation of time t1-t3 is repeated for the predetermined number of times. This allows the threshold voltage of the nMOS transistor NTr1 to rise, thereby adjustment of the threshold voltage being accomplished.

"BTI" herein means that the gate insulating film of the transistor deteriorates due to the voltage applied thereto and an ambient temperature thereof, thus making the operation of the transistor become unstable. When BTI occurs at a transistor, for example, a drive capability of the transistor deteriorates, and a threshold voltage thereof rises. This embodiment modifies the offset of the transistor formed in the memory cell 20 using this phenomenon. Note that this embodiment applies the voltage VDD2 (1.5 V) only to a transistor having a low threshold voltage to generate BTI for adjusting the offset.

BTI generated in an nMOS transistor is referred to as Positive BTI (PBTI). BTI generated in a pMOS transistor is referred to as Negative BTI (NBTI).

Moreover, because PBTI tends to occur in an nMOS transistor with a high dielectric constant gate insulation film, it is desirable that the nMOS transistors NTr1 and NTr2 included in the SRAM 10 according to this embodiment includes a high dielectric constant gate insulation film. Although only two bit lines BL are illustrated in FIG. 1 and FIG. 2, this embodiment is not limited to FIG. 1. The number of the bit lines BL and the number of the first circuit 40 are not limited to those illustrated in these figures.
[(2) When Reading Offset Information of the pMOS Transistors PTr1 and PTr2]

Figure 7:
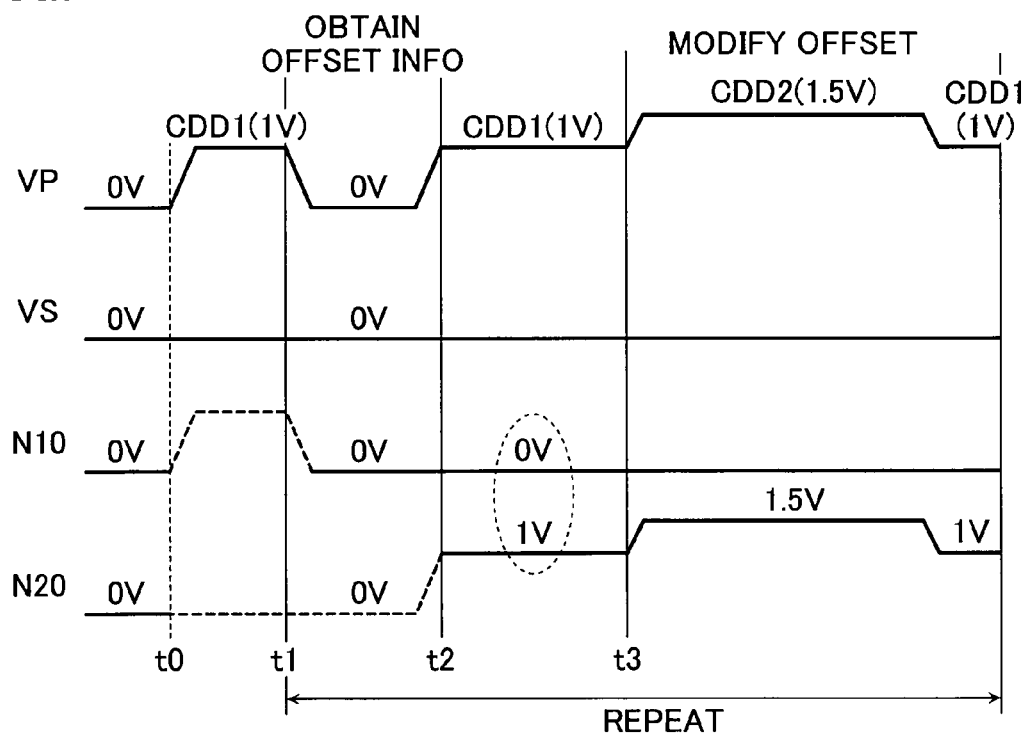
FIG. 7 is a timing chart showing an operation of reading offset information of memory cells, and adjusting the offset of the memory cells.

Then, with reference to a timing chart of FIG. 7, an operation when offset information of the pMOS transistor PTr1 and PTr2 is to be read is described. A case where a threshold voltage of the PMOS transistor PTr1 is lower than that of the pMOS transistor PTr2 is explained as an example hereinbelow. The modification of the threshold voltage is performed.

In this case, like in the case (1), the voltage VP is made equal to the voltage VS between time t1 and t2. But this case (2) is different from the case (1) in that the voltage VP is changed from the VDD1 (1.0 V) to 0 V, then again to VDD1.

The voltage VS is kept at 0 V. Accordingly, if the threshold voltage of the pMOS transistor PTr1 is smaller than the threshold voltage of the pMOS transistor PTr2, the former is in a conductive state, while the latter is in a non-conductive state, for example. This creates offset information at the nodes N10 and N20. An operation for offset adjustment is similar to that in the case (1).

[(3) When Reading Offset Information of All of the Transistors]

Figure 8:
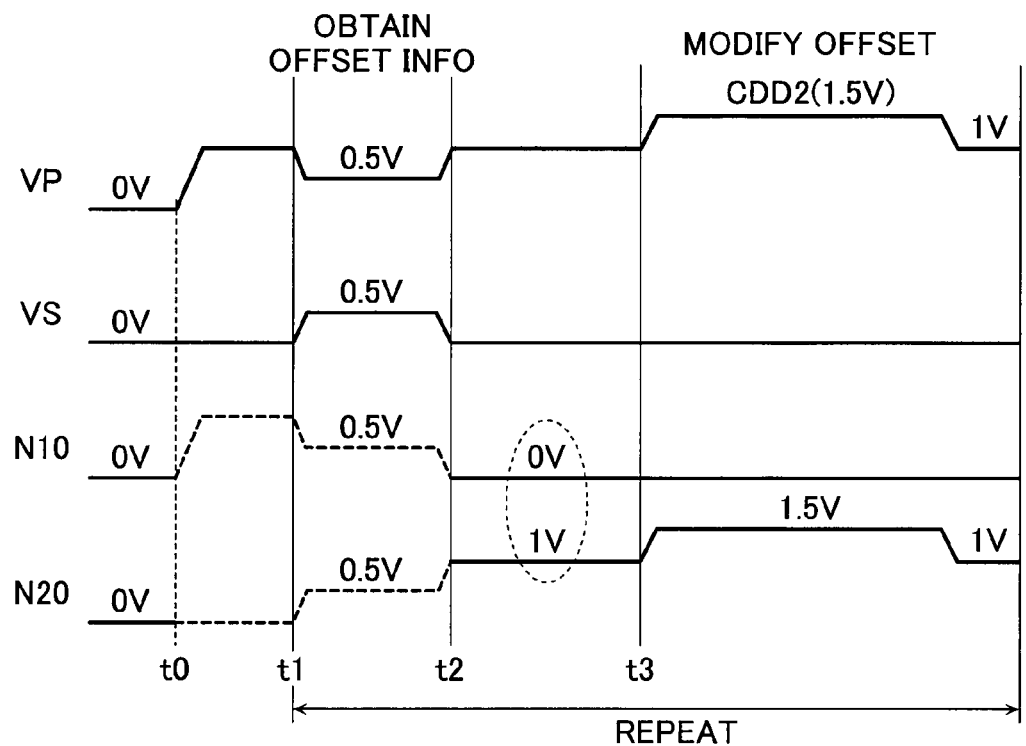
FIG. 8 is a timing chart showing an operation of reading offset information of memory cells, and adjusting the offset of the memory cells.

Finally, with reference to a timing chart of FIG. 8, the operation when offset information of all of the transistors (the nMOS transistors NTr1 and NTr2, and the pMOS transistors PTr1 and PTr2) in the memory cell 20 is to be read is described.

In this case, like in the case (1), the voltage VP is made equal to the voltage VS between time t1 and t2. But this case (3) is different from the cases (1) and (2) in that the voltage VP is changed from the VDD1 (1.0 V) to 0.5 V, then to 0 V. The voltage VS is changed from the 0 V to 0.5 V, then back to 0 V. Accordingly, either one of the pMOS transistors PTr1 or PTr2 having a lower threshold voltage is made ON, while the other is kept at OFF. Similarly, either one of the nMOS transistors NTr1 or NTr2 having a lower threshold voltage is made ON, while the other is kept at OFF. This creates offset information at the nodes N10 and N20. An operation for offset adjustment is similar to that in the case (1).

Advantage of SRAM 10 According to Embodiment

Then, an advantage of the semiconductor memory device 10 according to this embodiment is described. The semiconductor memory device 10 according to this embodiment is configured to trim offsets of the transistors formed in the memory cells 20 by changing a power supply applied to the memory cells 20. Therefore, offsets of the plural memory cells 20 may be formed at a time.

Others

Having now described exemplary embodiments of the present invention, it is to be understood that various modifications, additions, substitutions and deletions of the described embodiments may be implemented, without departing from the spirit of the present invention.

Figure 9:
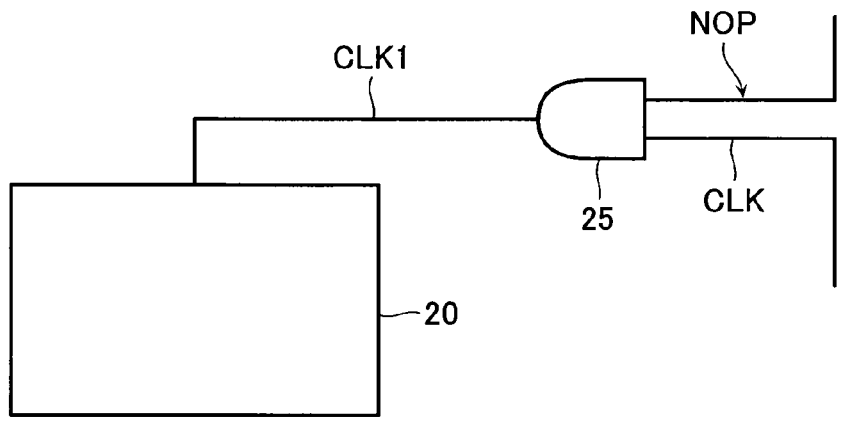
FIG. 9 illustrates another structure of the memory cell control unit 23.

For example, in the above-mentioned embodiments, the memory cell control unit 23 is AND-connected with a word line WL. But it is also possible to AND-connect a clock signal line CLK as shown in FIG. 9. Any modifications are included in the scope of the present invention as long as the memory cell control unit 23 can make a memory cell 20 be in a non-operating state.

What is claimed is:

1. A semiconductor memory device comprising:
a memory cell including a flip-flop including a first inverter and a second inverter connected to each other in a cross-coupling manner, the first inverter including first and second transistors connected to each other so that their current paths are serially connected, the second inverter including third and fourth transistors connected to each other so that their current paths are serially connected;
a first power supply terminal connected to a source electrode of the first transistor and a source electrode of the third transistor, and supplied with a first potential in a normal operation;
a second power supply terminal connected to a source electrode of the second transistor and a source electrode of the fourth transistor, and supplied with a second potential in a normal operation; and
a control circuit operative to control a voltage applied to the first power supply terminal and the second power supply terminal,
the control circuit being configured to perform control such that when offset information of the memory cell is to be read, a voltage applied to the first power supply terminal and a voltage applied to the second power supply terminal are made equal, then the voltage applied to the first power supply terminal is returned to the first potential, and the voltage applied to the second power supply terminal is returned to the second potential, whereas when stress is generated in the first to fourth transistor included in the first inverter or the second inverter, the potential difference between the first power supply terminal and the second power supply terminal is made larger than a difference between the first potential and the second potential.

2. The semiconductor memory device according to claim 1, wherein
the second transistor and the fourth transistor each have a high dielectric constant gate insulating film.

3. The semiconductor memory device according to claim 1, wherein
the control circuit repeats an operation of reading the offset information and an operation of generating the stress for a predetermined number of times.

4. The semiconductor memory device according to claim 1, wherein
when the offset information of the second and fourth transistors is to be read, the control circuit maintains the voltage applied to the first power supply terminal at the first potential, while the voltage applied to the second power supply terminal is switched from the second potential to the first potential during a certain period.

5. The semiconductor memory device according to claim 4, wherein the second transistor and the fourth transistor each have a high dielectric constant gate insulating film.

6. The semiconductor memory device according to claim 4, wherein
the control circuit repeats an operation of reading the offset information and an operation of generating the stress for a predetermined number of times.

7. The semiconductor memory device according to claim 1, wherein
when the offset information of the first and third transistors is to be read, the control circuit maintains the voltage applied to the second power supply terminal at the second potential, while the voltage applied to the first power supply terminal is switched from the first potential to the second potential during a certain period.

8. The semiconductor memory device according to claim 7, wherein
the control circuit repeats an operation of reading the offset information and an operation of generating the stress for a predetermined number of times.

9. The semiconductor memory device according to claim 1, wherein
the control circuit changes a voltage applied to the first power supply terminal from the first potential to a third potential as an intermediate potential between the first potential and the second potential during a certain period, while changes a voltage applied to the second power supply terminal from the second potential to the third potential during the certain period.

10. The semiconductor memory device according to claim 9, wherein
the control circuit repeats an operation of reading the offset information and an operation of generating the stress for a predetermined number of times.

11. The semiconductor memory device according to claim 1, wherein
the control circuit outputs an non-operation signal that prohibits an operation of the memory cell.

12. The semiconductor memory device according to claim 11, wherein
when the non-operation signal is output, the control circuit invalidates a selection signal for selecting the memory cell.

13. The semiconductor memory device according to claim 11, wherein
the control circuit outputs the non-operation signal according to a clock signal.

14. A method of trimming a memory cell in a semiconductor memory device, the memory cell including a first inverter and a second inverter connected to each other in a cross-coupling manner, the first inverter including first and second transistors connected to each other so that their current paths are serially connected, the second inverter including third and fourth transistors connected to each other so that their current paths are serially connected,
the method comprising:
after a voltage applied to a source electrode of the first transistor and a source electrode of the third transistor is equalized with a voltage applied to a source electrode of the second transistor and a source electrode of the fourth transistor, switching a voltage applied to the source electrode of the first transistor and the source electrode of the third transistor to a first potential, while switching a voltage applied to the source electrode of the second transistor and the source electrode of the fourth transistor to a second potential lower than the first potential, thereby reading offset information of the memory cell,
amplifying potential difference between a voltage applied to the source electrode of the first transistor and the source electrode of the third transistor and a voltage applied to the source electrode of the second transistor and the source electrode of the fourth transistor to a value larger than the difference between the first potential and the second potential, thereby generating a stress at the first to fourth transistors.

15. The method according to claim 14, wherein
the second transistor and the fourth transistor each have a high dielectric constant gate insulating film.

16. The method according to claim 14, wherein
when the offset information of the second and fourth transistors is to be read, the voltage applied to the first power supply terminal is maintained at the first potential, while the voltage applied to the second power supply terminal is switched from the second potential to the first potential during a certain period.

17. The method according to claim 16, wherein
the second transistor and the fourth transistor each have a high dielectric constant gate insulating film.

18. The method according to claim 14, wherein
an operation of reading the offset information and an operation of generating the stress is repeated for a predetermined number of times.

19. The method according to claim 14, wherein
when the offset information of the first and third transistors is to be read, the voltage applied to the second power supply terminal is maintained at the second potential, while the voltage applied to the first power supply terminal is switched from the first potential to the second potential during a certain period.

20. The method according to claim 14, wherein
when offset information is to be read, a voltage applied to the first power supply terminal is changed from the first potential to a third potential as an intermediate potential between the first potential and the second potential during a certain period, while a voltage applied to the second power supply terminal is changed from the second potential to the third potential during the certain period.

* * * * *